(12) United States Patent
Dadheech et al.

(10) Patent No.: US 8,492,053 B2
(45) Date of Patent: Jul. 23, 2013

(54) SURFACE TREATED CARBON COATINGS FOR FLOW FIELD PLATES

(75) Inventors: Gayatri Vyas Dadheech, Rochester Hills, MI (US); Mahmoud H. Abd Elhamid, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 387 days.

(21) Appl. No.: 12/861,261

(22) Filed: Aug. 23, 2010

(65) Prior Publication Data

US 2010/0323276 A1  Dec. 23, 2010

Related U.S. Application Data

(63) Continuation-in-part of application No. 12/181,864, filed on Jul. 29, 2008.

(51) Int. Cl.
    *H01M 8/04* (2006.01)
(52) U.S. Cl.
    USPC ............................ 429/514; 429/457; 429/400
(58) Field of Classification Search
    USPC .......................................... 429/400, 457, 514
    See application file for complete search history.

(56) References Cited

U.S. PATENT DOCUMENTS

| 2007/0015029 A1* | 1/2007 | Budinski et al. ................. 429/34 |
| 2007/0037040 A1* | 2/2007 | Koyama et al. .................. 429/44 |
| 2010/0028743 A1 | 2/2010 | Dadheech et al. |

FOREIGN PATENT DOCUMENTS

| DE | 102 30 395 A1 | 1/2004 |
| DE | 10 2007 003 825 A1 | 1/2007 |
| DE | 10 2007 038 171 A1 | 3/2008 |
| EP | 26496 A * | 4/1981 |

* cited by examiner

*Primary Examiner* — Nicholas P D'Aniello
(74) *Attorney, Agent, or Firm* — Dinsmore & Shohl LLP

(57) ABSTRACT

A flow field plate having a low resistance coating for fuel cell applications is described. In one embodiment, the flow field plate includes a metal plate having a first surface and a second surface, the first surface defining a plurality of channels for directing flow of a first gaseous composition; and an activated carbon coating disposed adjacent to at least a portion of the plate, the activated carbon coating having a surface resistance of less than about 20 m$\Omega \cdot$cm$^2$, the surface resistance being stable. Fuel cells incorporating the flow field plates and methods of making the flow field plates are also described.

14 Claims, 3 Drawing Sheets

SURFACE TREATED CARBON COATINGS FOR FLOW FIELD PLATES

RELATED CASES

This application is a Continuation-In-Part of U.S. application Ser. No. 12/181,864 filed Jul. 29, 2008, entitled AMORPHOUS CARBON COATINGS FOR FUEL CELL BIPOLAR PLATES, which is incorporated herein by reference.

BACKGROUND

The invention relates generally to fuel cells, and more particularly to flow field plates for fuel cells having surface treated carbon coatings thereon.

Electrochemical conversion cells, commonly referred to as fuel cells, produce electrical energy by processing reactants, for example, through the oxidation and reduction of hydrogen and oxygen. A typical polymer electrolyte fuel cell comprises a polymer membrane (e.g., a proton exchange membrane (PEM)) with catalyst layers on both sides. The catalyst coated PEM is positioned between a pair of gas diffusion media layers, and a cathode plate and an anode plate (or bipolar plates) are placed outside the gas diffusion media layers. The components are compressed to form the fuel cell.

The bipolar plates act as current collectors for the anode and cathode. They have channels and opening for distributing the fuel cell's gaseous reactants over the surface of the anode or cathode catalysts. (The plates will be referred to as bipolar plates hereinafter, but they could also be unipolar anode or cathode plates as is understood by those of skill in the art.)

Bipolar plates for fuel cells need to be corrosion resistant, and electrically conductive (e.g., a resistance of less than about 20 $m\Omega \cdot cm^2$). Desirably, they should also be low cost. The most commonly used bipolar plates currently in use are made of stainless steel. Stainless steel is advantageous because of its mechanical strength when made into thin sheets. However, untreated stainless steel has a passive oxide film which has high resistance (about 250 $m\Omega \cdot cm^2$). Consequently, the oxide coating needs to be removed, and the stainless steel coated with a conductive coating, such as a gold coating or a polymeric carbon coating, in order to be used in fuel cells. These coatings generally require expensive equipment to deposit, which adds to the cost of the finished plate.

Currently, gold is frequently used as the conductive coating on bipolar plates. In some cases, the coating is approximately 3-5 nm thick. The gold coating provides low contact resistance (less than about 20 $m\Omega \cdot cm^2$). However, the high cost of gold makes the use of a gold coating in a fuel cell undesirable. In addition, it is difficult to make a defect-free coating because the coating is so thin. Defects in the gold coating create islands of exposed stainless steel. Over time, the air in the system reacts with the exposed stainless steel, and an oxide layer of about 1-3 nm can build up on the surface. The oxide layer formed by this competing reaction can cover the gold coating, rendering the surface with high contact resistance.

In addition, it would be advantageous for part of the coating to be hydrophilic while another part is hydrophobic. Most of the plate material is desirably hydrophilic to assist with stability issues at lower power. A hydrophilic coating helps to remove water from the bipolar plate. However, the exit manifold is desirably hydrophobic so that the water does not stick as it is exiting the bipolar plate and block the exit manifolds, which would result in back flow of water.

Therefore, there is a need for a low cost, corrosion resistant, electrically conductive coating with desired surface properties for use on bipolar plates in fuel cells.

SUMMARY OF THE INVENTION

The present invention meets this need. One aspect of the invention is a flow field plate having a low resistance coating for fuel cell applications. In one embodiment, the flow field plate includes a metal plate having a first surface and a second surface, the first surface defining a plurality of channels for directing flow of a first gaseous composition; and an activated carbon coating disposed adjacent to at least a portion of the plate, the activated carbon coating having a surface resistance of less than about 20 $m\Omega \cdot cm^2$, the surface resistance being stable. By adjacent, we mean next to, but not necessarily directly next to. There could be layers in between adjacent layers.

Another aspect of the invention is a fuel cell. One embodiment of the fuel cell includes a first flow field plate comprising: a metal plate having a first surface and a second surface, the first surface defining a plurality of channels for directing flow of a first gaseous composition; and an activated carbon coating disposed adjacent to at least a portion of the plate, the activated carbon coating having a surface resistance of less than about 20 $m\Omega \cdot cm^2$, the surface resistance being stable; a first catalyst layer disposed over the first flow field plate; an ion conductor layer disposed over the first catalyst layer; a second catalyst layer disposed over ion conductor layer; and a second flow field plate disposed over the second catalyst layer.

Another aspect of the invention is a method of making a flow field plate. In one embodiment, the method includes providing a metal plate having a first surface and a second surface, the first surface defining a plurality of channels for directing flow of a first gaseous composition; depositing a carbon coating adjacent to at least a portion of the plate; and activating a surface of the carbon coating so that it has a surface resistance of less than about 20 $m\Omega \cdot cm^2$, the surface resistance being stable.

BRIEF DESCRIPTION OF THE INVENTION

Figure 3A:
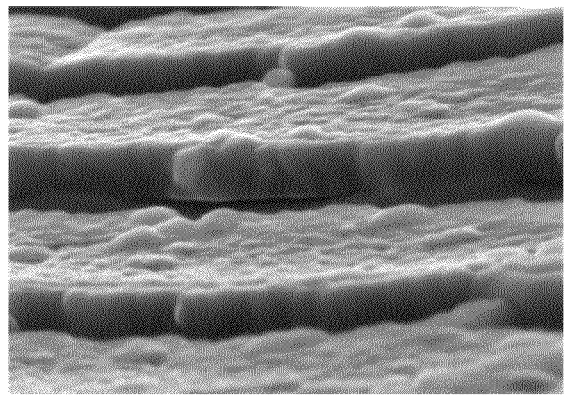
Figure 3B:
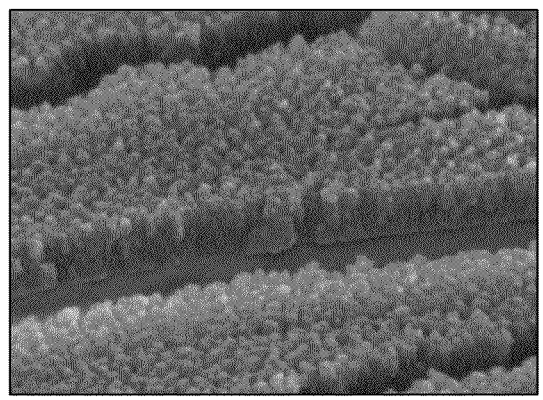

FIGS. 3A-B are SEM images showing a perspective view of a carbon coating before and after plasma treatment.

DETAILED DESCRIPTION OF THE INVENTION

Carbon is inexpensive and highly conductive. It has been found that amorphous carbon can be used as an alternative to gold coatings on bipolar plates for fuel cells. Application Ser. No. 12/181,864, filed Jul. 29, 2008, and entitled Amorphous Carbon Coatings for Fuel Cell Bipolar Plates, which is incorporated herein by reference, describes the use of a non-crystalline carbon layer disposed over at least a portion of the metal plate. The surface of the non-crystalline carbon layer can be activated using a plasma treatment to be hydrophilic.

It has been discovered that graphitic carbon coating can be used as well as amorphous carbon layer, and that the surface can be activated to be either hydrophilic or hydrophobic.

In one embodiment, a flow field plate for use in a fuel cell is provided. The flow field plate comprises a metal plate (typically stainless steel although other metals could be used if desired) with a carbon layer disposed over at least a portion of the metal plate.

Figure 1A:
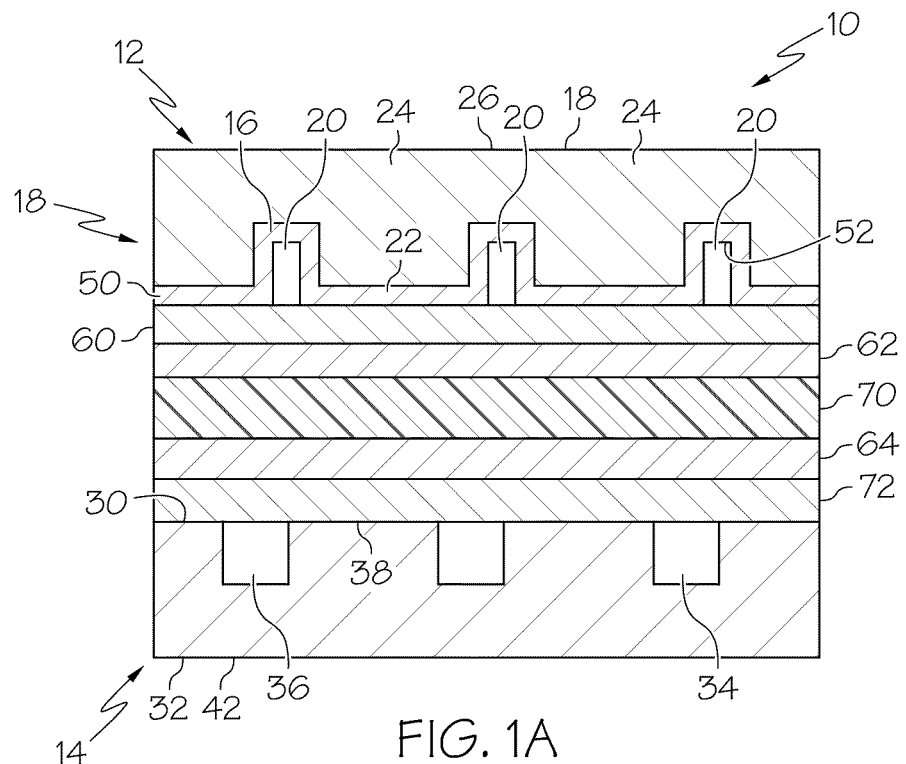
FIG. 1A is a cross-sectional view of a fuel cell incorporating a carbon layer on a unipolar plate.
Figure 1B:
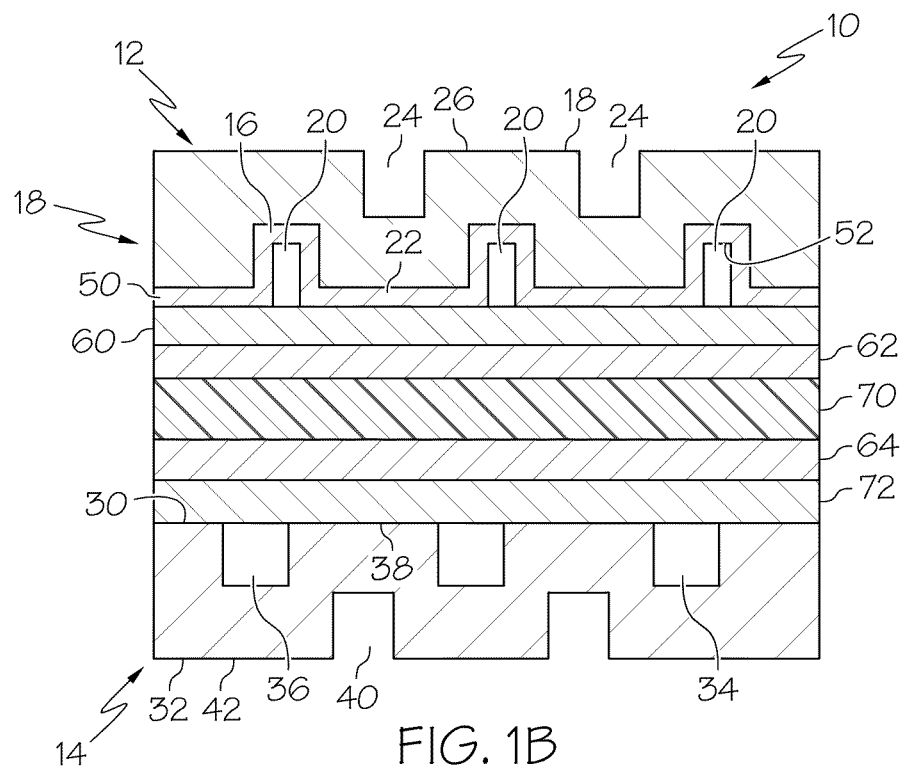
FIG. 1B is a cross-sectional view of a fuel cell incorporating a carbon layer on a bipolar plate.

With reference to FIGS. 1A and 1B, cross sections of fuel cells incorporating the flow field plates of this embodiment is provided. Fuel cell 10 includes flow field plates 12, 14. Flow field plate 12 includes surface 16 and surface 18. Surface 16 defines channels 20 and lands 22. FIG. 1A provides a depiction in which flow field plate 12 is a unipolar plate.

FIG. 1B illustrates a flow field plate 12 which is a bipolar plate. In this variation, surface 18 defines channels 24 and lands 26. Similarly, flow field 14 includes surface 30 and surface 32. Surface 30 defines channels 36 and lands 38, and surface 32 defines channels 40 and lands 42.

A carbon layer 50 is disposed over and contacts surface 16. There could also be a carbon layer on one or more of surfaces 18, 30, and 32, if desired.

The fuel cell 10 further includes gas diffusion layer 60 and catalyst layers 62, 64. Polymeric ion conductive membrane 70 is interposed between catalyst layers 62, 64. Finally, fuel cell 10 also includes gas diffusion layer 72 positioned between catalyst layer 64 and flow field plate 14.

In one variation of the present invention, a first gas is introduced into channels 20 and a second gas is introduced into channels 36. Channels 20 direct the flow of the first gas, and channels 36 direct the flow of the second gas. In a typical fuel cell application, an oxygen-containing gas is introduced into channels 20, and a fuel is introduced into channels 36. Suitable oxygen containing gases include, but are not limited to, molecular oxygen (e.g., air). Suitable fuels include, but are not limited to, hydrogen. When an oxygen-containing gas is introduced into channels 20, water is usually produced as a by-product which must be removed via channels 20. In this variation, catalyst layer 62 is a cathode catalyst layer and catalyst layer 64 is an anode catalyst layer.

The surface resistance of the activated carbon coating on the plate should be less than about 20 mΩ·cm$^2$. The surface resistance should remain stable over time.

The carbon coating is typically about 5 to about 1000 nm thick, or about 5 to about 750 nm, or about 5 to about 500 nm, or about 5 to about 250 nm, or about 5 to about 150 nm, or about 5 to about 100 nm, or about 5 to about 50 nm. The carbon coatings (both amorphous and graphitic) can be deposited by a variety of processes. The coatings should be non-hydrogenated for conductivity. Suitable deposition processes for the carbon coatings include, but are not limited to, physical vapor deposition (PVD) processes, chemical vapor deposition processes (CVD) (e.g., low pressure CVD, atmospheric CVD, plasma enhanced CVD, laser assisted CVD, etc.), sputtering (e.g., magnetron, unbalanced magnetron, etc.), other plasma processes, evaporation (thermal, e-beam, arc evaporation), and the like.

As used herein, the terms carbon coating or carbon layer refer to a coating or layer made substantially completely of carbon (allowing for impurities). However, there is no polymer matrix or other binder in the coating or layer.

Figure 2:
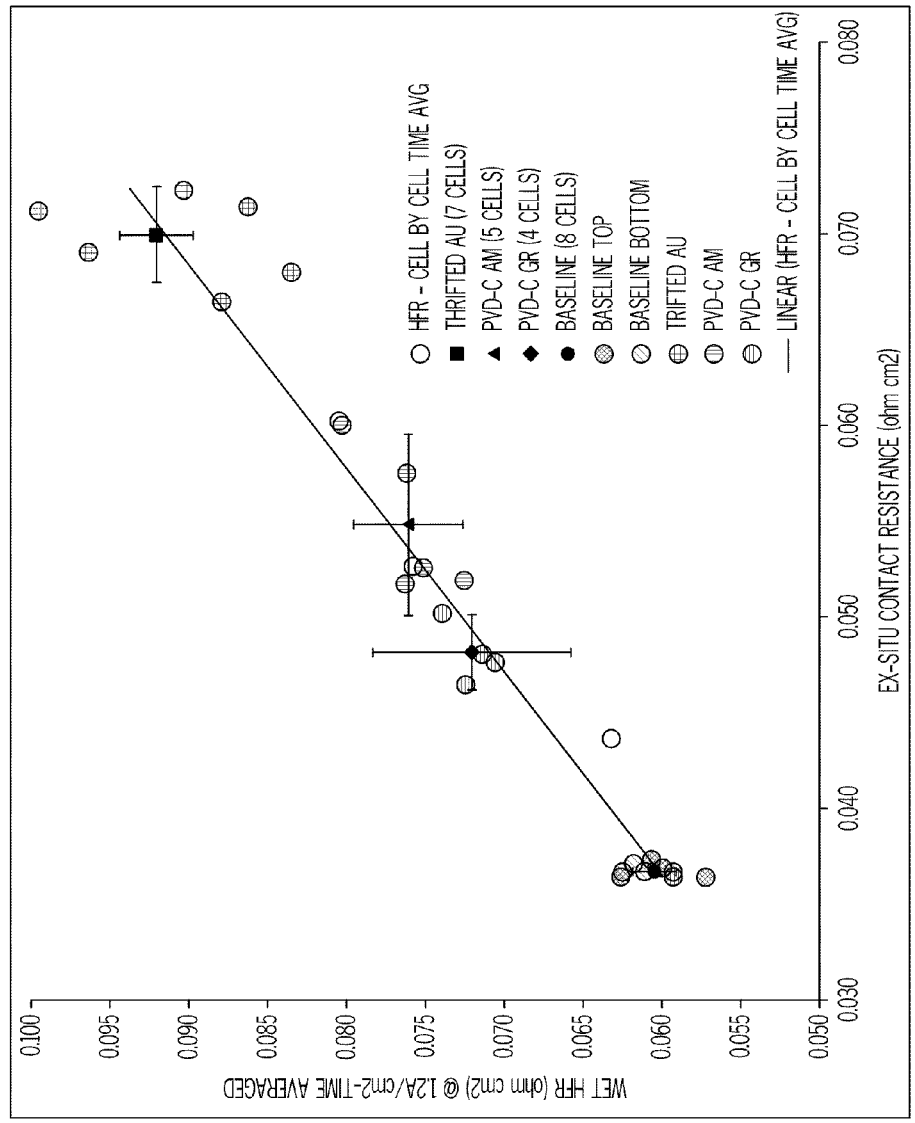
FIG. 2 is a graph showing the resistance of amorphous and graphitic carbon (without post-treatment) and gold coatings on stainless steel plates.

As shown in FIG. 2, bipolar plates coated with a PVD carbon coating (amorphous and graphitic) without any post-treatment showed a resistance about 12-15 mV higher than the baseline gold coated plates (100% coverage). This difference in resistance was maintained throughout the testing (about 5200 hr). The thrifted gold coating (about 50% coverage) had a higher resistance than either of the carbon coatings. In addition, it was difficult to obtain reproducible contact resistance, and the resistance increased over time.

In order to improve long-term performance, the carbon coatings are subjected to an activation step. The activation typically involves exposing the carbon coatings to a plasma. Suitable plasma treatments include, but are not limited to, RF plasma, DC plasma, microwave plasma, hot filament plasma, open air plasma, and the like. The surface could be activated in other ways, including but not limited to chemical activation. Chemical activation includes, but is not limited to treatment, such as etching, of the surface with an acid, such as sulfuric acid, hydrofluoric acid, chromic acid, potassium permanganate, and the like.

The plasma treatment can use a reactive plasma or a non-reactive plasma. Reactive plasma gases include, but are not limited to, oxygen containing gases, nitrogen containing gases, and fluorinated gases. Non-reactive plasma gases include, but are not limited to, inert gases, such as argon, and the like.

Reactive plasmas are desirable because the reactive plasma breaks the bonds faster and creates a large number of bond cleavage and removal which provides the surface with a desired roughness that benefits the contact resistance. For example, a reactive oxygen containing gas, such as pure oxygen, activates the carbon layer by breaking bonds and forming hydroxyl, carboxyl, and aldehyde functional groups. Reactive nitrogen containing gases, such as nitrogen, nitrous oxide, nitrogen dioxide, ammonia, and the like, or mixtures thereof, activate the carbon layers by breaking bonds and forming nitrogen-based derivatives like amines, amides, and diazo functional groups. Thus, the activation process permits an increase in the amount of oxygen and/or nitrogen in the carbon layer.

The plasma treatment can be performed for between about 5 sec to about 10 min, or about 5 sec to about 5 min, or about 5 sec to about 3 min, or about 5 sec to about 1 min, or about 30 sec to about 45 sec. When a reactive plasma treatment is longer than about 3 min, it can lead to removal of too much carbon, resulting in the coating becoming non-uniform.

As deposited, the carbon coating has a combination of graphite and diamond moieties. Thus, it has both sp2 and sp3 carbon molecules. The plasma treatment removes some of the loosely bonded sp3 carbon atoms. This increases the ratio of sp2 carbon to sp3 carbon from an initial ratio of about 0.2 to post-treatment ratio of about 1 or more. The increased ratio of sp2 carbon to sp3 carbon makes the coating more graphitic, which increases the conductivity of the carbon coating.

The plasma treatment also creates a microstructure with increased surface area due to the nanoporosity caused by the removal of the sp3 carbon. The increased nanoporosity provides more contact points for the carbon coating with the fibers of the gas diffusion media (GDM). The increased nanoporosity makes the carbon surface more hydrophilic, which helps to remove the water quickly from the cell. When the cell is operating at low power and there is not enough gas flow to remove the water, the increased nanoporosity of the surface of the carbon coating helps to remove water, thereby improving the low power stability of the fuel cell.

The nanoporosity of the carbon layer is characterized by the roughness average of the surface of the carbon layer. Table 1 shows that the surface roughness increases following activation. The roughness average of the surface after activation is generally about 200 to about 1000 nm RMS, or about 300 to about 900 nm, or about 400 to about 700 nm.

Although an increased roughness is desired, too much of an increase in the roughness can result in damage and loss of corrosion stability of the stainless steel substrate to the bipolar plate. The increase in surface roughness after activation is generally in the range of about 50 to about 500 nm, or about 50 to about 400 nm, or about 50 to about 300 nm, or about 75 to about 200 nm, or about 75 to about 150 nm, or about 75 to about 125 nm, or about 75 to about 100 nm. Either average roughness or RMS average roughness can be used.

TABLE 1

| Parameters | With Post-Treatment | No Post-Treatment |
|---|---|---|
| Ra (average roughness) | 213 nm | 118 nm |
| RMS (rootmean square roughness) Average | 276 nm | 164 nm |
| Peak to valley ratio (PV) | 3330 nm | 2622 nm |
| SRz (areal roughness) | 1530 nm | 1110 nm |

In addition, the plasma treatment allows the surface of the carbon coating to be tailored depending on its end use. The coating can be made hydrophilic using reactive gases including, but not limited to, oxygen containing gases, and nitrogen containing gases. Hydrophilic coatings help to reduce or eliminate low performing cells at low current densities by helping to remove water from the cell.

It has also been found that the carbon coating can be rendered hydrophobic by changing the carrier gas for the reactive plasma. Hydrophobic coatings can be obtained using reactive gases including, but not limited to, fluorinated gases, such as fluorine gas, difluoromethane, trifluoromethane, difloroethane, tetrafluoroethane, and the like. Using these gases, the plasma treatment creates the nanoporosity as well attaches polarizable functional groups. This could be done on the inlet and exit manifolds and tunnel area as the morphology created by post plasma treatment would be required for maintaining super hydrophobic contact angles.

This would allow a portion of the carbon coating to be hydrophilic while another part (the inlet and outlet manifolds and tunnel areas) can be hydrophobic. One method of making a partially hydrophilic/partially hydrophobic carbon coating is as follows. The carbon coating plate could be exposed to a first reactive gas to make the surface, for example hydrophilic. The area that is to remain hydrophilic could be blocked, and the second reactive gas would then be introduced and the non-blocked area would be treated to be hydrophobic. It could be done so that the first surface is hydrophobic and the second surface is hydrophilic, if desired.

In the hydrophilic areas of the carbon coating, the contact angle of the carbon layer is desirably less than about 40 degrees, or less than about 35 degrees. or less than about 30 degrees. or less than about 25 degrees. or less than about 20 degrees.

In the hydrophobic areas of the carbon coating, the contact angle of the carbon layer is desirably about 110 to about 160 degrees, or about 140 to about 160 degrees.

There can be an optional interface layer to provide adhesion between the stainless steel plate and the carbon coating. The interface layer is typically a metal coating. Suitable metal coatings include, but are not limited to, chromium, titanium, zirconium, hafnium, noble metals, or combinations thereof. The interface layer is typically about 1 to about 50 nm thick, or about 1 to about 45 nm, or about 1 to about 40 nm, or about 1 to about 35 nm, or about 1 to about 30 nm, or about 1 to about 25 nm, or about 1 to about 20 nm, or about 1 to about 15 nm, or about 1 to about 10 nm, or about 5 to about 10 nm.

EXAMPLE

A PVD carbon coating 10 to 200 nm was applied to a bipolar plate. The PVD carbon coating was exposed to a reactive plasma containing 100% oxygen for less than 1 min. FIGS. 2A-B show a comparison between the PVD carbon coating before (A) and after (B) the reactive plasma treatment. The images show sharp contact points created by reactive plasma treatment that reduce the contact angle.

The carbon coated, plasma treated bipolar plate was then placed in a fuel cell and tested. The resistance ($m\Omega \cdot cm^2$) of the activated carbon coated (both graphitic and amorphous) bipolar plate was comparable to a bipolar plate with a baseline gold coating initially and after over 5000 hrs, as shown in Table 2. The resistance of the activated carbon coatings in the stack was stable over time. By stable we mean that it increased less than about 5 $m\Omega \cdot cm^2$ after at least 5000 hrs, or less than about 4 $m\Omega \cdot cm^2$, or less than about 3 $m\Omega \cdot cm^2$, or less than about 2 $m\Omega \cdot cm^2$, or less than about 1 $m\Omega \cdot cm^2$, or less than about 0.5 $m\Omega \cdot cm^2$.

TABLE 2

| Gold Reference | Graphitic @ BOL (49 hrs) | Graphitic @ EOL (5137 hrs) | Amorphous @ BOL (49 hrs) | Amorphous @ EOL (5137 hrs) |
|---|---|---|---|---|
| 58.7 | 63.6 | 63.7 | 60.3 | 61.3 |

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the term "device" is utilized herein to represent a combination of components and individual components, regardless of whether the components are combined with other components. For example, a "device" according to the present invention may comprise an electrochemical conversion assembly or fuel cell, a vehicle incorporating an electrochemical conversion assembly according to the present invention, etc.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:
1. A proton exchange membrane fuel cell comprising:
a membrane electrode assembly comprising a catalytic anode configured to accept a hydrogen-bearing reactant, a catalytic cathode configured to accept an oxygen-bearing reactant and a medium cooperative with the anode and the cathode such that upon catalytic transformation of the reactants, the positively-charged one of the catalytically-transformed reactants travels from the anode to the cathode through the medium prior to reacting with the negatively-charged one of the catalytically-transformed reactants;

a metal plate fluidly cooperative with the membrane electrode assembly and having at least one surface thereon that defines a plurality of channels for directing flow of at least one of the reactants therethrough; and an activated carbon coating disposed adjacent to at least a portion of the at least one surface, the activated carbon coating having a surface resistance of less than about 20 $m\Omega \cdot cm^2$, the surface resistance being stable.

2. The fuel cell of claim 1 wherein at least a portion of the carbon coating is hydrophilic.

3. The fuel cell of claim 1 wherein at least a portion of the carbon coating is hydrophobic.

4. The fuel cell of claim 1 wherein at least a portion of the carbon coating is hydrophilic and at least a portion of the carbon coating is hydrophobic.

5. The fuel cell of claim 1 wherein the carbon layer has a thickness of about 5 to about 50 nm.

6. The fuel cell of claim 1 further comprising an interface layer between the plate and the carbon coating.

7. The fuel cell of claim 6 wherein the interface layer is chromium, titanium, zirconium, hafnium, noble metals, or combinations thereof.

8. The fuel cell of claim 1 wherein a ratio of sp2 carbon to sp3 carbon for the activated carbon coating is greater than a ratio of sp2 carbon to sp3 carbon for the carbon coating before activation.

9. The fuel cell of claim 1 wherein a nanoporosity of the activated carbon coating is greater than a nanoporosity of the carbon coating before activation.

10. A proton exchange membrane fuel cell comprising:

a membrane electrode assembly comprising a catalytic anode configured to accept a hydrogen-bearing reactant, a catalytic cathode configured to accept an oxygen-bearing reactant and a medium cooperative with the anode and the cathode such that upon catalytic transformation of the reactants, the positively-charged one of the catalytically-transformed reactants travels from the anode to the cathode through the medium prior to reacting with the negatively-charged one of the catalytically-transformed reactants; and a first flow field plate comprising:

a metal plate having a first surface and a second surface, the first surface defining a plurality of channels for directing flow of a first gaseous composition; and an activated carbon coating disposed adjacent to at least a portion of the plate, the activated carbon coating having a surface resistance of less than about 20 $m\Omega \cdot cm^2$, the surface resistance being stable, the first flow field plate cooperative with the membrane electrode assembly through respective contact with the anode and the cathode.

11. The fuel cell of claim 10 wherein at least a portion of the carbon coating is hydrophilic and at least a portion of the carbon coating is hydrophobic.

12. The fuel cell of claim 10 wherein the carbon layer has a thickness of about 5 to about 50 nm.

13. The fuel cell of claim 10 further comprising an interface layer between the plate and the carbon coating.

14. The fuel cell of claim 13 wherein the interface layer is chromium, titanium, zirconium, hafnium, noble metals, or combinations thereof.

\* \* \* \* \*